(12) United States Patent
Kitta

(10) Patent No.: US 6,563,897 B1
(45) Date of Patent: May 13, 2003

(54) MULTIRATE SYMBOL TIMING RECOVERY CIRCUIT

(75) Inventor: Tatsuaki Kitta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/375,212

(22) Filed: Aug. 16, 1999

(30) Foreign Application Priority Data

Sep. 28, 1998 (JP) .............................. 10-272862

(51) Int. Cl.[7] .................................................. H03D 3/24
(52) U.S. Cl. ...................................... 375/375; 375/232
(58) Field of Search .............................. 375/232, 235, 375/371, 373, 375, 376, 327, 339, 342, 355, 350, 344; 329/325, 360, 307; 327/147, 156, 150, 159

(56) References Cited

U.S. PATENT DOCUMENTS

| | | | | |
|---|---|---|---|---|
| 4,906,941 A | * | 3/1990 | Kato et al. ................... | 327/159 |
| 5,570,390 A | * | 10/1996 | Kaku et al. ................... | 375/222 |
| 6,236,263 B1 | * | 5/2001 | Iwamatsu .................... | 329/306 |
| 6,249,557 B1 | * | 6/2001 | Takatori et al. ............. | 375/355 |
| 6,314,145 B1 | * | 11/2001 | van Driest ................... | 375/326 |

* cited by examiner

*Primary Examiner*—Phuong Phu
(74) *Attorney, Agent, or Firm*—Arent Fox Kintner Plotkin & Kahn, PLLC (57) ABSTRACT

A symbol timing recovery circuit of the type that controls the phase of a received signal to synchronize it to a clock is capable of accommodating differing symbol rates. Base clock frequency $f_{samp}$ is divided by N to derive frequency $f_{samp'}$, where N is the largest integer contained in a set of integers by any of which the base frequency $f_{samp}$ can be divided to derive a frequency more than twice as high as symbol rate $f_s$, and sampling clock CLK3 of the frequency $f_{samp'}$ is used in an FIR filter 20. $\Delta$th is added to the output of a loop filter 38, and the result is supplied to an NCO 42. The value of $\Delta$th is determined from the difference between $2f_s$ and $f_{samp'}$.

8 Claims, 7 Drawing Sheets

(a)
d(r-1)>d(r)>d(r+1)
MONOTONICALLY DECREASING d(r-1)  d(r)  d(r+1)

2×d(r)−{d(r+1)+d(r−1)}
=2×5−(−9+9)
=10

(b)
d(r-1)<d(r)<d(r+1)
MONOTONICALLY INCREASING d(r-1)  d(r)  d(r+1)

−2×d(r)+{d(r+1)+d(r−1)}
=−2×(−4)+(−9+9)
=8

(c)
d(r-1)>d(r)>d(r+1)
MONOTONICALLY DECREASING d(r-1)  d(r)  d(r+1)

2×d(r)−{d(r+1)+d(r−1)}
=2×(−4)−(+9−9)
=−8

(d)
d(r-1)<d(r)<d(r+1)
MONOTONICALLY INCREASING d(r-1)  d(r)  d(r+1)

MULTIRATE SYMBOL TIMING RECOVERY CIRCUIT

BACKGROUND OF THE INVENTION

1. Field of the Invention

The present invention relates to a symbol timing recovery circuit, for recovering the symbol timing of a received signal and, more particularly, to a multirate symbol timing recovery circuit capable of accommodating differing symbol rates, and to a recording medium having a program recorded thereon for enabling a computer to design the same.

2. Description of the Related Art

Several methods are practiced to recover timing for discriminating symbols contained in a received signal (symbol timing); for example, in one method, symbol frequency components are extracted from the received signal; and in another, the timing of the symbol discrimination clock is controlled so as to synchronize it to the symbol timing of the received signal.

In Japanese Unexamined Patent Publication No. 4-104542, there is proposed a technique that lends itself to digital implementation and that, if implemented digitally, is capable of processing high-speed signals; this technique, as opposed to the above-described method, controls the symbol timing of the received signal so as to synchronize it to a fixed-frequency clock by controlling the tap coefficients-of a finite impulse response (FIR) filter through which the received signal is passed.

This technique of synchronizing the symbol timing of the received signal to a fixed clock uses a clock frequency (sampling frequency) higher than twice the symbol rate of the received signal. Here, the sampling frequency must be chosen to fall within capture range. That is, the sampling frequency must be set at twice the symbol rate (or an integral multiple thereof).

Therefore, if the symbol rate of the input signal changes, the sampling frequency must also be changed correspondingly. If the symbol rate of the input signal changes by an n-th submultiple of the fundamental frequency, the change can be accommodated by changing the divide-by ratio in the frequency divider. However, if signals of symbol rates of 5 Mbauds and 3.4 Mbauds, for example, are both to be accommodated, the necessary sampling frequency cannot be generated by a simple divide-by operation, but external circuitry such as a crystal oscillator must be changed or a complex frequency dividing circuit-must be provided.

SUMMARY OF THE INVENTION

Accordingly, it is an object of the present invention to provide a multirate symbol timing recovery circuit capable of accommodating differing symbol rates without having to provide a complex frequency dividing circuit or to change external circuitry. It is another object of the invention to provide a recording medium having a program recorded thereon for enabling a computer to design such a timing recovery circuit.

According to the present invention, there is provided a multirate symbol timing recovery circuit comprising: a frequency divider for frequency-dividing a first clock to produce a second clock; a finite impulse response filter for computing, from the value of an input signal at the timing of the second clock, values at a zero-crossing point and a data discrimination point of the input signal at the timing of the second clock by using supplied tap coefficients, and for outputting the computed values, thereby shifting the phase of the zero-crossing point and the data discrimination point of the input signal so as to match the timing of the second clock; a phase comparator for detecting a phase error occurring at the zero-crossing point appearing at an output of the finite impulse response filter; a loop filter for passing therethrough low-frequency components contained in an output of the phase comparator; an adder for adding a prescribed value to an output of the loop filter; an oscillator for outputting a signal whose frequency varies with a value output from the adder; and a tap coefficient determining device for determining the tap coefficients based on an output of the oscillator, and for supplying the tap coefficients to the finite impulse response filter.

According to the present invention, there is also provided a recording medium having a program recorded thereon for enabling a computer to design a multirate symbol timing recovery circuit comprising: a frequency divider for frequency-dividing a first clock to produce a second clock; a finite impulse response filter for computing, from the value of an input signal at the timing of the second clock, values at a zero-crossing point and a data discrimination point of the input signal at the timing of the second clock by using supplied tap coefficients, and for outputting the computed values, thereby shifting the phase of the zero-crossing point and the data discrimination point of the input signal so as to match the timing of the second clock; a phase comparator for detecting a phase error occurring at the zero-crossing point appearing at an output of the finite impulse response filter; a loop filter for passing therethrough low-frequency components contained in an output of the phase comparator; an adder for adding a prescribed value to an output of the loop filter; an oscillator for outputting a signal whose frequency varies with a value output from the adder; and a tap coefficient determining device for determining the tap coefficients based on an output of the oscillator, and for supplying the tap coefficients to the finite impulse response filter.

DESCRIPTION OF THE PREFERRED EMBODIMENTS

Figure 1:
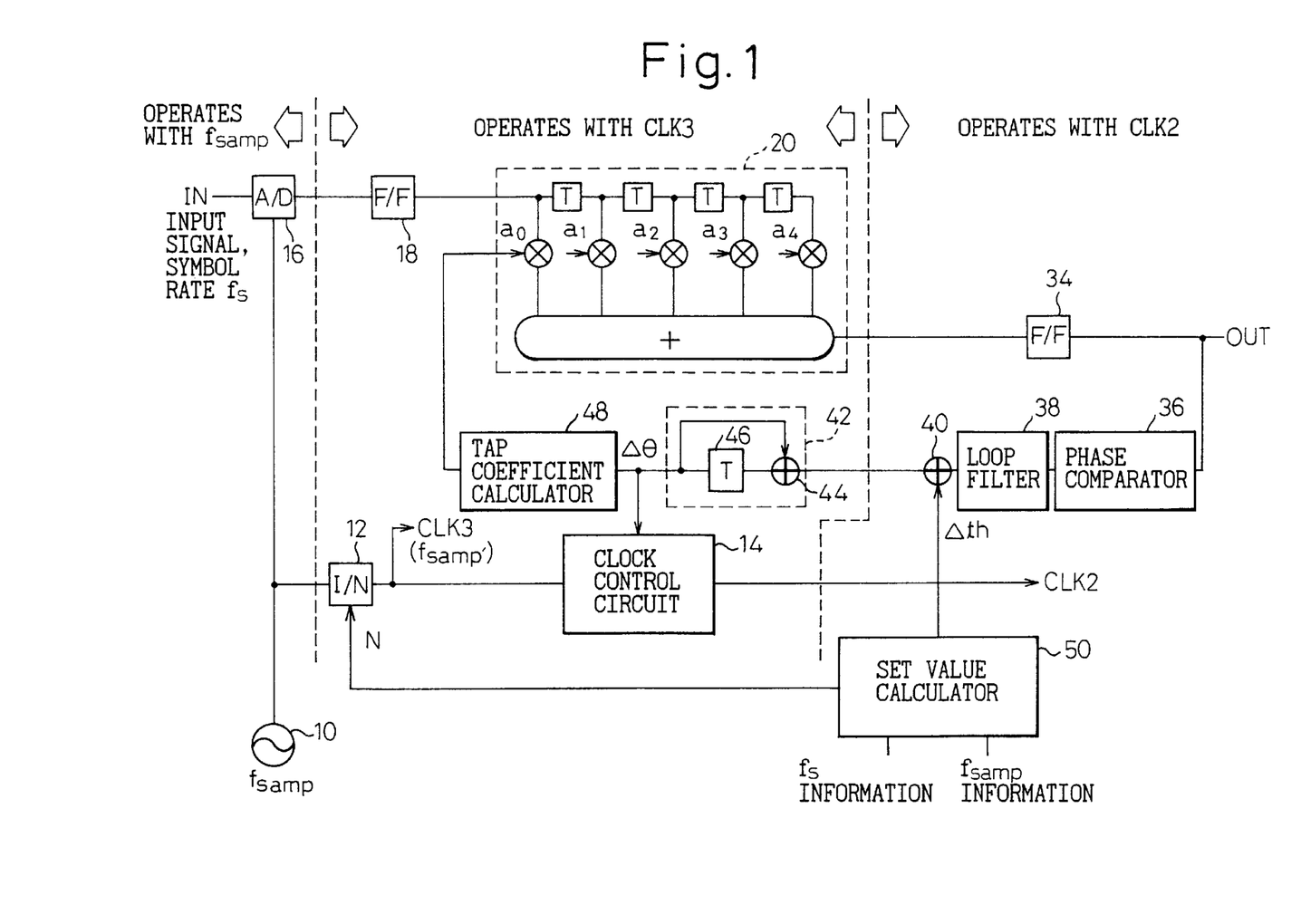
FIG. 1 is a circuit block diagram of a multirate symbol timing recovery circuit according to the present invention.

FIG. 1 is a circuit block diagram of a multirate symbol timing recovery circuit according to one, embodiment of the present invention.

The frequency $f_{samp}$ of the sampling clock produced by an oscillator 10 is higher than twice the highest frequency expected of the symbol rate $f_s$ of the input signal to be processed. A frequency divider 12 divides the clock frequency $f_{samp}$ by an integer N to derive a clock CLK3 of frequency $f_{samp'}$ which is higher than $2f_s$. The method of determining the integer N will be described later. A clock control circuit 14 partially inhibits the clock CLK3 to derive a clock CLK2 whose frequency is equal to $2f_s$, though its period is not always constant. The operation of the clock control circuit 14 also will be described later.

An A/D converter 16 converts the input analog signal of the symbol rate $f_s$ into a digital value for output, in synchronism with the timing of the clock of frequency $f_{samp'}$. A flip-flop 18 latches the input signal and outputs it in synchronism with the timing of the clock CLK3. An FIR filter is a five-tap digital transversal filter consisting of four delay elements in cascade, five multipliers, and an adder, and operates with the clock CLK3. An FIR filter having a larger number of taps may be used.

Figure 2:
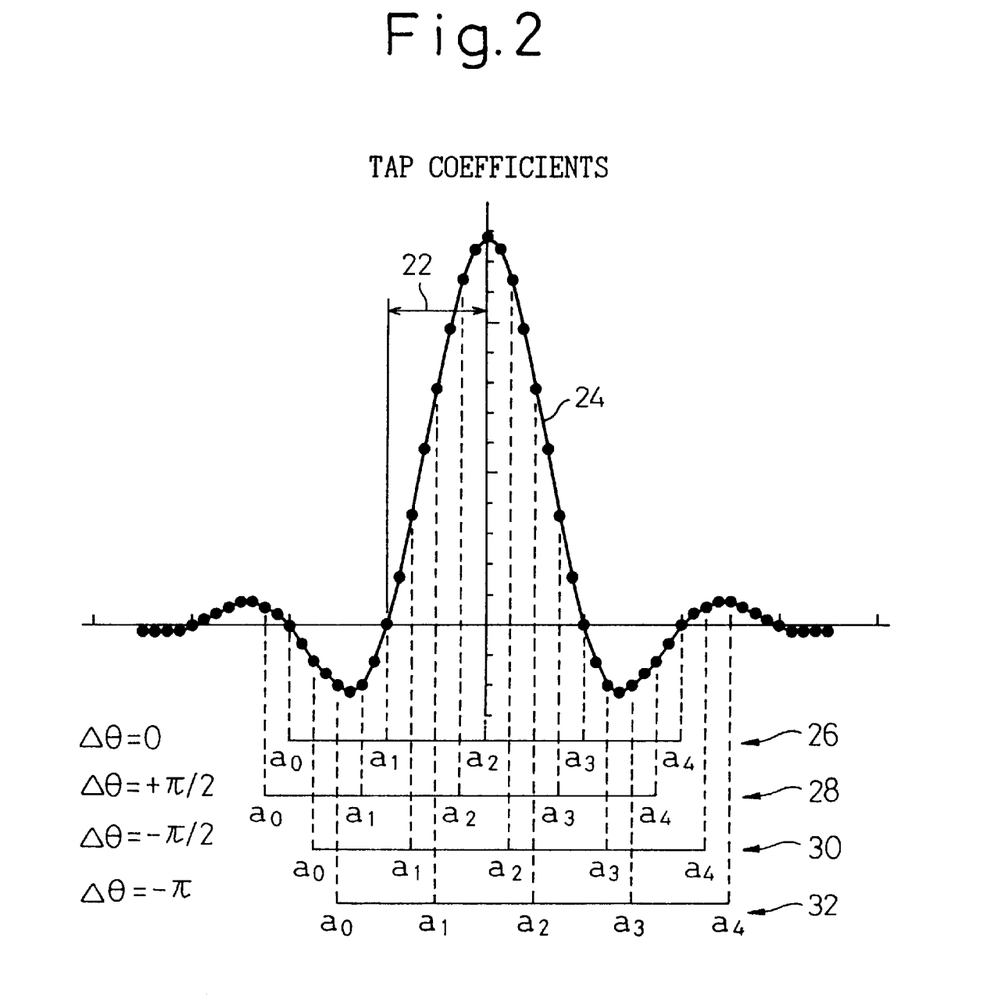
FIG. 2 is a diagram for explaining symbol phase control performed by an FIR filter 20.

FIG. 2 is a diagram for explaining the operation of the FIR filter 20. Arrow 22 indicates one cycle period T of the clock CLK3, and curve 24 corresponds to the impulse response of a low-pass filter having a passband up to $2f_s$. When the five values indicated at reference numeral 26 are supplied as tap coefficients $a_0$ to $a_4$ to the FIR filter 20, since all the tap coefficients except $a_2$ are zero, the FIR filter 20 becomes a simple delay unit with a delay time of 2 T. When the five values indicated at reference numeral 28 are supplied as tap coefficients $a_0$ to $a_4$ to the FIR filter 20, the FIR filter provides a delay time of $2T-T/4$, thus advancing the phase of the output signal by $\pi/2$ compared with the case of the tap coefficients indicated at 26. Likewise, when the five values indicated by reference numeral 30 or 32 are supplied as tap coefficients $a_0$ to $a_4$ to the FIR filter 20, the phase of the output signal is delayed by $\pi/2$ or $\pi$, respectively. In this way, the phase of the output signal can be varied by varying the values supplied as the tap coefficients $a_0$ to $a_4$.

Figure 3:
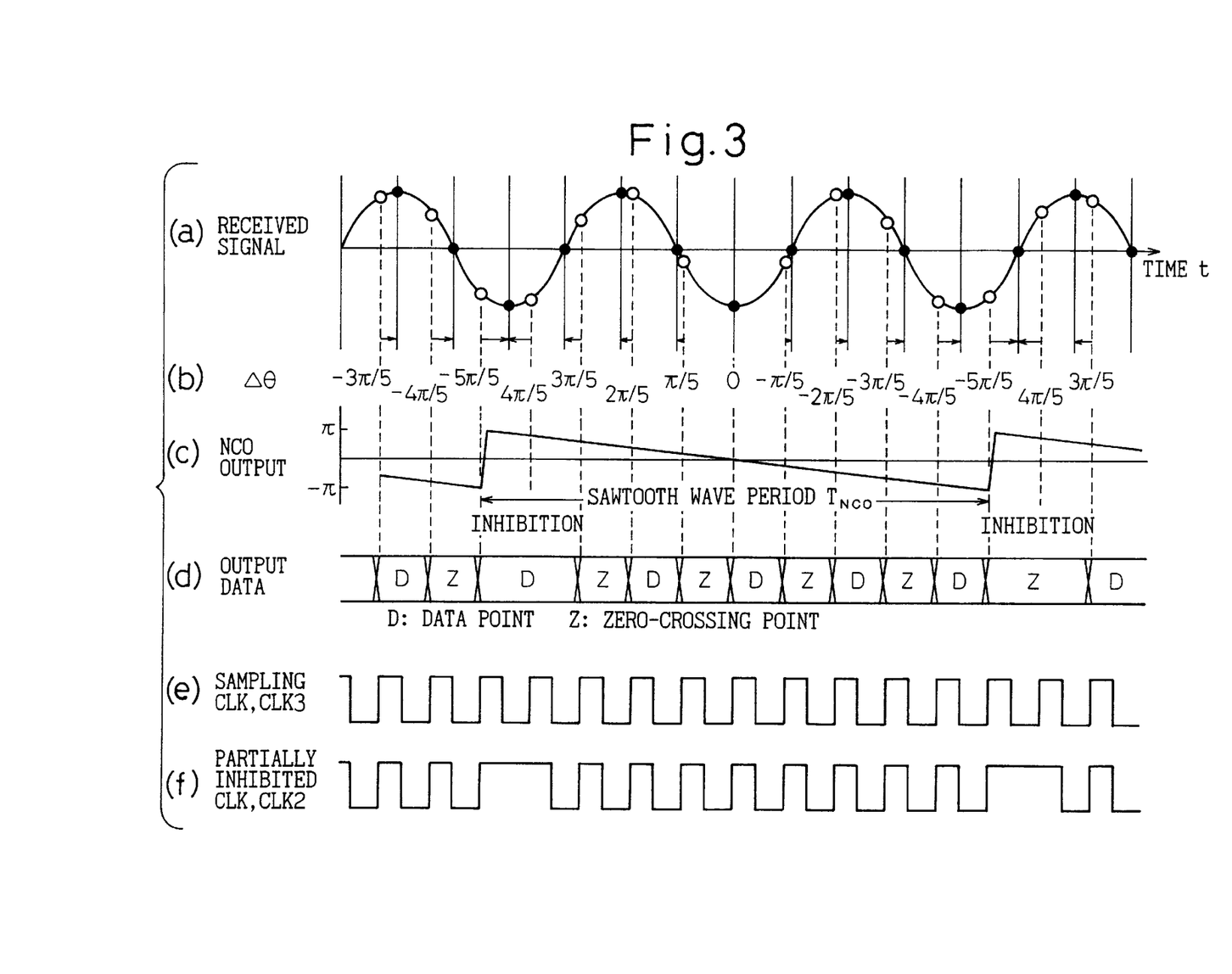
FIG. 3 is a waveform diagram for explaining the operation of the multirate symbol timing recovery circuit according to the present invention.

The curve in part (a) of FIG. 3 shows an analog input signal, where open circles indicate the sampling points with the clock CLK3 and solid circles indicate the zero-crossing points or the data discrimination points of the input signal. At the first sampling point (the leftmost open circle in part (a)), the phase of the data discrimination point is advanced by $-3\pi/5$ (delayed by $3\pi/5$), as shown in part (b); therefore, by supplying the FIR filter 20 with the tap coefficients $a_0$ to $a_4$ for advancing the phase by $3\pi/5$, the value at the data discrimination point is output at the first sampling point. At the next sampling point, the phase of the zero-crossing point is advanced by $-4\pi/5$ (delayed by $4\pi/5$); therefore, by supplying the FIR filter 20 with the tap coefficients for advancing the phase by $4\pi/5$, the value at the zero-crossing point is output at the second sampling point. At the third and fourth sampling points, since the value at the data discrimination point located between them is output at either sampling point after the phase correction by the FIR-filter 20, the fourth sampling point is removed by a flip-flop 34 operating with the partially inhibited clock CLK2.

In this way, the value at a data discrimination point and the value at a zero-crossing point are alternately output from the flip-flop 34 in synchronism with the timing of the partially inhibited clock CLK2. In other words, symbol timing is thus recovered.

Figure 4:
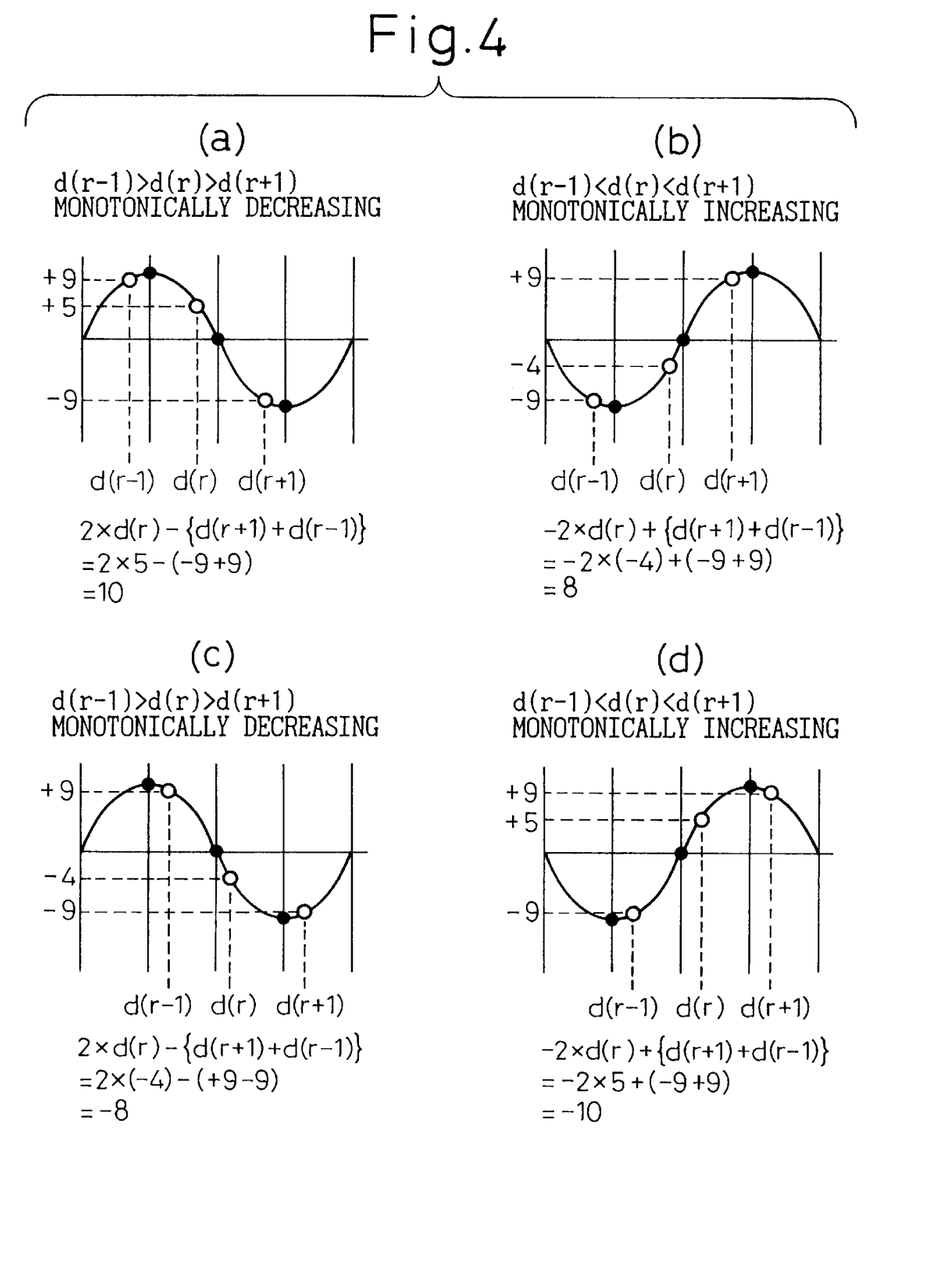
FIG. 4 is a diagram for explaining the principle of phase comparisons in a phase comparator 36.

A phase comparator 36 detects a phase error occurring at the zero-crossing point appearing at the output of the flip-flop 34. As shown in FIG. 4, the phase comparator 36 compares the value d(r) at the zero-crossing point with the value d(r-1) at the preceding data discrimination point and also with the value d(r+1) at the succeeding data-discrimination point; if the value is monotonically decreasing, i.e., $d(r-1)>d(r)>d(r+1)$, the phase error is calculated by $$d(r)-d(r+1)-\{d(r-1)-d(r)\}=2d(r)-\{d(r+1)+d(r-1)\}$$

If the value is monotonically increasing, i.e., $d(r-1)<d(r)<d(r+1)$, the phase error is detected by $$d(r+1)-d(r)-\{d(r)-d(r-1)\}=-2d(r)+\{d(r+1)+d(r-1)\}$$

If the value is neither monotonically increasing nor monotonically decreasing, the phase error is not updated. In the example of FIG. 4, part (a) and part (b) show the case where the signal phase is delayed (the phase of the sampling point is advanced); in this case, a positive value is output from the phase comparator 36. Part (c) and part (d) show the case where the signal phase is advanced (the phase of the sampling point is delayed); in this case, a negative value is output from the phase comparator 36.

The output of the phase comparator 36 is fed through a loop filter 38 to an adder 40 where Δth is added, thereby determining the frequency of a numerically controlled oscillator 42.

The numerically controlled oscillator (NCO) 42 consists of an adder 44 and a delay element 46. The output of the delay element (flip-flop) 46 is fed back to one input of the adder 44. The delay element 46 operates with the sampling clock CLK3. Since the output of the adder 44 changes at a speed proportional to the output of the adder 40 in synchronism with the timing of the clock CLK3, the output of the NCO 42 becomes a sawtooth wave as shown in part (c) of FIG. 3, the frequency of the sawtooth wave being proportional to the output of the adder 40. A tap coefficient calculator 48 defines the maximum value of the sawtooth wave as $+\pi$ and the minimum value as $-\pi$, and determines the tap coefficients according to the value of the sawtooth wave. For example, when the output of the NCO 42 is 0, the tap coefficients indicated at 26 in FIG. 2 are chosen, and when the output is $\pi/2$, the coefficients indicated at 28 are chosen. When the tap coefficients thus determined by the tap coefficient calculator 48 are supplied to the FIR filter 20, the phase of the zero-crossing point and data discrimination point is synchronized to the sampling clock CLK3. The partial inhibition in the clock control circuit 14 is performed, as shown in parts (e), and (f) of FIG. 3, at the timing when the output of the NCO 42 shown in part (c) changes from negative to positive. By latching the output of the FIR filter 20 with the partially inhibited clock CLK2, values at the data discrimination points and values at the zero-crossing points alternately appear at the output of the flip-flop 34, as shown in part (d).

Next, a description will be given of how the divide-by factor N in the frequency divider 12 and the addend Δth in the adder 40 are determined by a set value calculator 50. Denoting the sawtooth wave period as $T_{NCO}$, the following equation holds after the loop has settled.

$$1/T_{NCO}=f_{samp'}-2f_S \qquad (1)$$

Assuming that, at this time, the output of the loop filter 38 stabilizes at "0", the input to the NCO 42 is equal to Δth, and the following relation holds.

$$T_{NCO}=(2^M/\Delta th)\times(1/f_{samp'}) \qquad (2)$$

where M is the number of bits in the adder 44.

The value of the frequency $f_{samp}$ of the oscillator 10 and the value of the symbol rate $f_s$ of the input signal are supplied to the set value calculator 50. The set value calculator 50 sets as N the largest integer contained in a set of integers by any of which the frequency $f_{samp}$ can be divided to derive a frequency higher than $2f_s$. Since the relations (1) and (2) hold after the loop has-settled, from (1) and (2) the following equation is obtained.

$$\Delta th=2^M \times (f_{samp'}\text{-}2f_s)/f_{samp'}$$

Δth is thus determined.

Adding Δth in the adder 40 means bringing the NCO operation almost to a settling point despite of existence of the output of the loop filter 38. When this is viewed as a loop, in the early stage of the circuit operation, frequency synchronization is almost achieved in the timing recovery circuit, only the phase being different, and the capture range of the timing recovery circuit is greatly expanded. More specifically, by adding Δth, the operable ratio of $f_{samp'}$ to $2f_s$ ($f_{samp'}/2f_s$), formerly at about 1.1, is expanded up to about 1.8 to 1.9. This has been confirmed through simulation.

Next, a description will be given of how signals of symbol rates of 5 Mbauds and 3.4 Mbauds are received by the above circuit (assuming that $f_{samp}$ is 32 MHz and the number of bits in the NCO 42 is 13).

When receiving a 5-Mbaud signal, first the N value for the divide-by-N frequency divider 12 is obtained. If $f_{samp}$ is to be divided by N to derive the smallest rate ($f_{samp'}$) of all possible rates greater than twice the symbol rate, then N=3. Hence $$f_{samp'}=32 \text{ MHz}/3=10.67 \text{ MHz}$$

Next, the addend Δth in the adder 40 is obtained by $$\Delta th=2^M \times (f_{samp'}\text{-}2f_s)/f_{samp'}=2^{13} \times (10.67 \times 10^6 - 2 \times 5 \times 10^6)/(10.67 \times 10^6) \approx 514$$

When receiving a 3.4-Mbaud signal, first the N value for the frequency divider 12 is obtained. If $f_{samp}$ is to be divided by N to derive the smallest rate ($f_{samp'}$) of all possible rates greater than twice the symbol rate, then N =4. Hence $$f_{samp'}=32 \text{ MHz}/4=8.0 \text{ MHz}$$

Next, the addend Δth in the adder 40 is obtained by $$\Delta th=2^M \times (f_{samp'}\text{-}2f_s)/f_{samp'}=2^{13} \times (8.0 \times 10^6 - 2 \times 3.4 \times 10^6)/(8.0 \times 10^6) \approx 1229$$

Thus, in the circuit of FIG. 1, the signal of a symbol rate of 5 Mbauds can be received by setting N=3 and Δth=514. Likewise, the signal of a symbol rate of 3.4 Mbauds can be received by setting N=4 and Δth= 1229.

Figure 5:
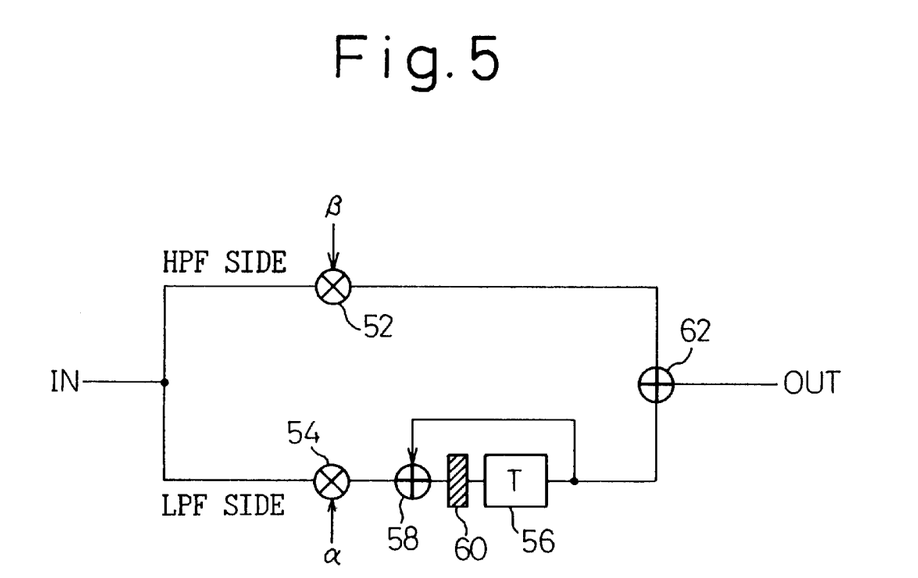
FIG. 5 is a circuit block diagram showing the details of a loop filter 38.

FIG. 5 shows the configuration of a filter suitable for use as the loop filter 38 (FIG. 1) in the multirate symbol timing recovery circuit of the present invention. In FIG. 5, reference numerals 52 and 54 are multipliers which multiply the input IN by values α and β, respectively, α for adjusting the gain of the LPF side and β for adjusting the gain of the HPF side. Reference numeral 56 is a flip-flop forming part of a complete integrator, 58 is an adder forming part of the complete integrator, and 60 is a limiter for the complete integrator. Reference numeral 62 is an adder which sums the outputs of the HPF and LPF sides to produce the output of the filter as a whole. A major feature of this configuration is the limiter 60. This limiter is configured to reset the complete integrator when the output of the complete integrator reaches an upper or a lower limit value. This acts to prevent the loop filter from running out of control when the quality of the input signal is bad (due to low C/N, large carrier shift, etc.) and to hasten the lockup time for symbol timing recovery.

Figure 6:
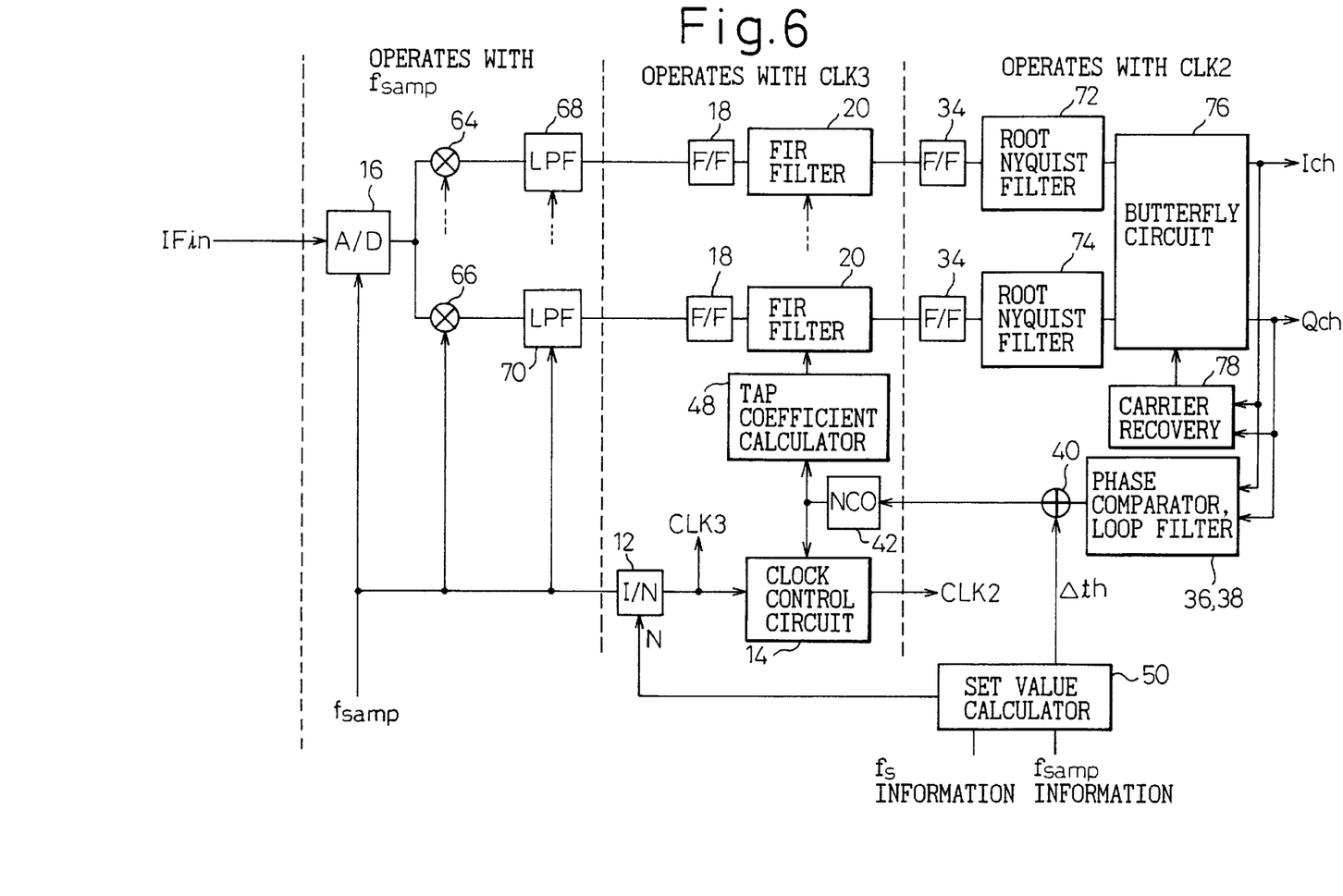
FIG. 6 is a circuit block diagram of a receiver circuit in which the multirate symbol timing recovery circuit of the present invention is used.

FIG. 6 shows an example in which the multirate symbol timing recovery circuit of the present invention is combined with an QPSK demodulator circuit to construct a receiver circuit. The same constituent elements as those shown in FIG. 1 are designated by the same reference numerals, and explanatory descriptions thereof will not be repeated here.

In FIG. 6, the input signal converted at frequency $f_{samp}$ into a digital value is supplied to multipliers 64 and 66. Carriers varying with $f_{samp}$ are supplied as IF carriers to the other inputs of the multipliers 64 and 66. When one carrier changes from 0 to 1 to 0 to −1, the other carrier changes from 1 to 0 to −1 to 0. That is, since the carriers are shifted in phase by π/2 with respect to each other, an I-phase and a Q-phase baseband signal are obtained. However, since $f_{samp}$ is not perfectly synchronized to the IF carrier, the signal points are rotating in the I-Q plane with a frequency equal to the difference between them.

As previously described, these baseband signal components are each sampled by the flip-flop 18 using the clock CLK3 with the frequency $f_{samp}$ (=$f_{samp'}/$N) which is higher than twice the symbol rate $f_s$, and in the FIR filter 20, the zero-crossing points and data discrimination points are shifted in phase to-match the timing of the CLK3; then, in the flip-flop 34, overlapping portions are removed to obtain the signal synchronized to the partially inhibited clock CLK2 whose frequency is equal to twice the symbol rate $f_s$. The signals are then passed through root Nyquist filters 72 and 74 and fed to a butterfly circuit 76. In the butterfly circuit 76, the supplied signals are multiplied by signals rotating with the frequency of residual carrier components, to remove the residual carrier components. A carrier recovery circuit 78 controls the rotation of the signals supplied to the butterfly circuit 76 by detecting the rotation of the signals at the outputs of the butterfly circuit 76. Detection of symbol timing errors by the phase comparator 36 is also performed at the outputs of the butterfly circuit 76.

Figure 7:
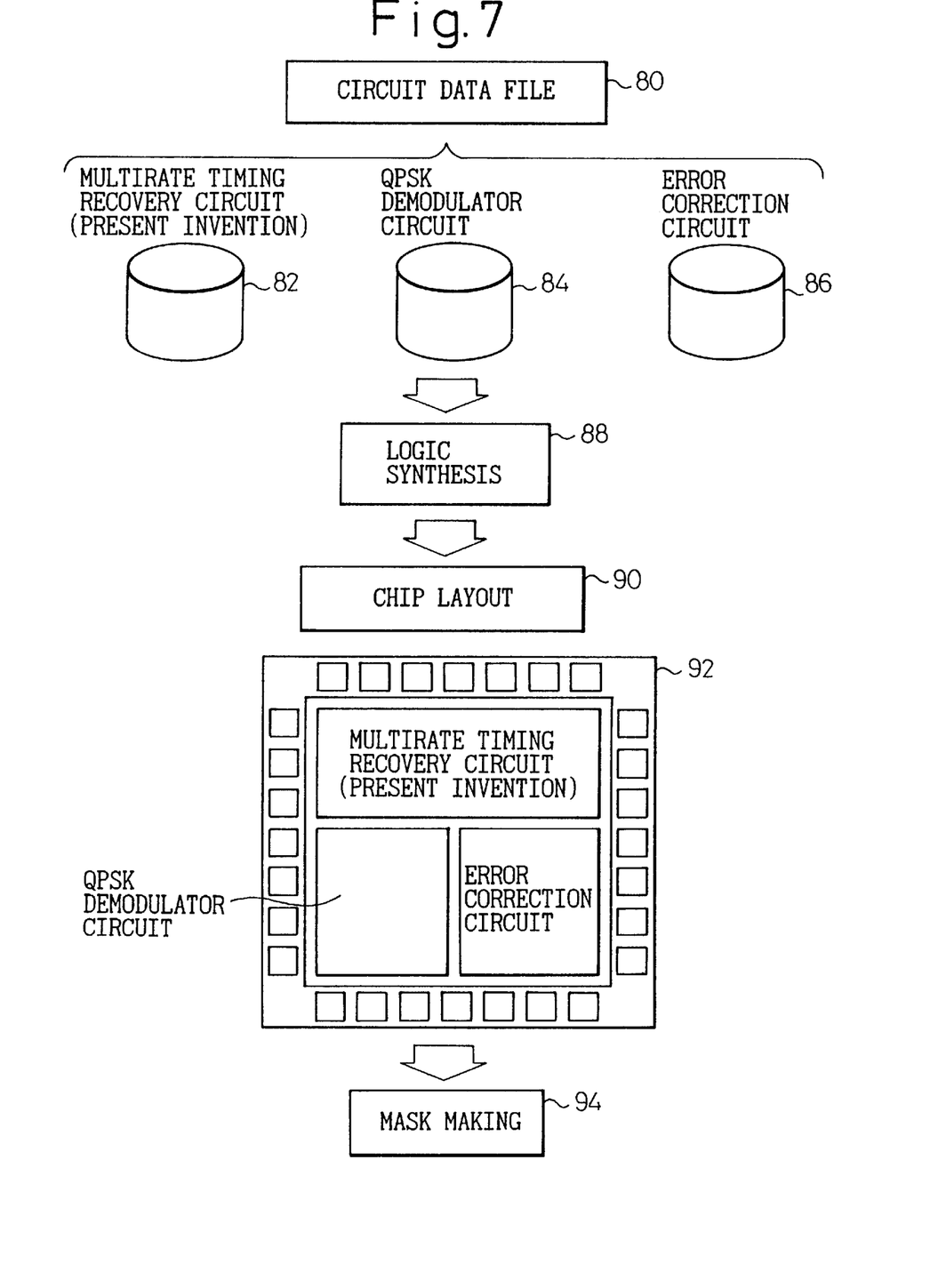
FIG. 7 is a diagram for explaining a fabrication process for a system LSI incorporating the multirate symbol timing recovery circuit of the present invention.

FIG. 7 shows a schematic diagram of a mask pattern making process for a system LSI incorporating the multirate symbol timing recovery circuit of the present invention.

First, circuit data (program) is created at the Register Transfer Level (RTL) using a hardware description language such as Verilog-HDL or VHDL, and the data is stored in a circuit data file 80. Since it is easy for those skilled in the art to create such a program based on FIGS. 1 and 5 and the descriptions given in connection therewith, the contents of the program written with a hardware description language for the implementation of the multirate symbol timing recovery circuit of the present invention will not be described here.

When the program 82 for the multirate symbol timing recovery circuit is input, together with programs 84 and 86 for a QPSK demodulator circuit and an error correction circuit, into a logic synthesis tool operating on a computer, optimum logic circuits are generated. Next, by inputting the results of this logic circuit design to an automatic layout tool 90 operating on a computer, the arrangement of microcells on the chip and the interconnections 92 between them are determined.

From the result of the layout, a mask pattern for the fabrication of the LSI is automatically produced by a mask making tool 94.

The program written in the above process with a hardware description language for the implementation of the multirate symbol timing recovery circuit of the present invention can be recorded on a recording medium such as a magnetic tape or CD-ROM and delivered by itself as an IP (Intellectual Property) core.

As described above, according to the multirate symbol timing recovery circuit of the present invention, timing recovery for different input symbol rates, which has traditionally required the provision of a complex clock generating circuit, can be accomplished in a simple manner by just changing the setting and without changing external circuitry.

What is claimed is:

1. A multirate symbol timing recovery circuit comprising:
a frequency divider for frequency-dividing a first clock to produce a second clock;
a finite impulse response filter for computing, from the value of an input signal at the timing of said second clock, values at a zero-crossing point and a data discrimination point of said input signal at the timing of said second clock by using supplied tap coefficients, and for outputting said computed values, thereby shifting the phase of said zero-crossing point and said data discrimination point of said input signal so as to match the timing of said second clock;
a phase comparator for detecting a phase error occurring at the zero-crossing point appearing at an output of said finite impulse response filter;
a loop filter for passing therethrough low-frequency components contained in an output of said phase comparator;
an adder for adding a prescribed value to an output of said loop filter;
an oscillator for outputting a signal whose frequency varies with a value output from said adder; and
a tap coefficient determining device for determining said tap coefficients based on an output of said oscillator, and for supplying said tap coefficients to said finite impulse response filter.

2. A multirate symbol timing recovery circuit according to claim 1, further comprising a set value calculator for determining a divide-by factor in said frequency divider and said prescribed value to be added in said adder from the frequency of said first clock and the symbol rate of said input signal, and for setting said determined values in said frequency divider and said adder, respectively.

3. A multirate symbol timing recovery circuit according to claim 2, wherein said set value calculator determines as the divide-by factor in said frequency divider the largest integer contained in a set of integers by any of which the frequency of said first clock can be divided to derive a frequency higher than twice the symbol rate of said input signal.

4. A multirate symbol timing recovery circuit according to claim 3, wherein said set value calculator determines said prescribed value from the difference between the frequency of said second clock and a frequency equivalent to twice said symbol rate.

5. A multirate symbol timing recovery circuit according to claim 1, further comprising:
an analog/digital converter for converting said input signal into a digital value in synchronism with the timing of said first clock; and
a flip-flop for latching said digital value, varying with the timing of said first clock, at the timing of said second clock, and for outputting said latched value for supply to said finite impulse response filter.

6. A multirate symbol timing recovery circuit according to claim 1, wherein an integrator in said loop filter is reset when said integrator reaches an upper limit value or a lower limit value.

7. A multirate symbol timing recovery circuit comprising:
a frequency divider for frequency-dividing a first clock to produce a second clock;
a finite impulse response filter for computing values at a zero-crossing point and a data discrimination point of an input signal by using supplied tap coefficients in synchronization with said second clock and for outputting said computed values, thereby synchronizing said zero-crossing point and said data discrimination point of said input signal with said second clock;
a phase comparator for detecting a phase error occurring at the zero-crossing point appearing at an output of said finite impulse response filter;
a loop filter for passing therethrough low-frequency components contained in an output of said phase comparator;
an adder for adding a prescribed value to an output of said of said loop filter;
an oscillator for outputting a signal whose frequency tap varies with a value output from said adder; and
a tap coefficient determining device for determining said tap coefficients based on an output of said oscillator, and for supplying said tap coefficients to said finite impulse response filter.

8. A multirate symbol timing recovery circuit comprising:
a frequency divider for frequency dividing a first clock to produce a second clock;
a finite impulse response filter for adjusting data discrimination point of an input signal to the timing of said second clock by using supplied tap coefficients;
a phase comparator for detecting a phase error occurring at a zero-crossing point appearing at output of said finite impulse response filter;
a loop filter for passing therethrough low frequency components contained in an output of said comparator;
an adder for adding a prescribed value to an output of said loop filter;
an oscillator for outputting a signal whose frequency varies with a value of an output from said adder; and
a tap coefficient determining device for determining said tap coefficients based on an output of said oscillator.

* * * * *